United States Patent

Mashiko et al.

[11] 4,377,734
[45] Mar. 22, 1983

[54] METHOD FOR FORMING PATTERNS BY PLASMA ETCHING

[75] Inventors: Yoji Mashiko, Nishinomiya; Hirozo Takano; Haruhiko Abe, both of Takarazuka; Sotoju Asai; Kazuo Mizuguchi, both of Amagasaki; Sumio Nomoto, Itami, all of Japan

[73] Assignee: Mitsubishi Denki Kabushiki Kaisha, Japan

[21] Appl. No.: 195,380

[22] Filed: Oct. 9, 1980

[30] Foreign Application Priority Data

Oct. 13, 1979 [JP] Japan .............................. 54-133896

[51] Int. Cl.³ .............................................. B23K 9/00
[52] U.S. Cl. ...................... 219/121 PE; 219/121 PF; 219/121 EK; 156/628; 156/643; 156/646; 204/192 N
[58] Field of Search .................. 219/121 PE, 121 PD, 219/121 PF, 121 PG, 121 PH, 121 ES, 121 EK; 204/192 E, 192 N; 156/628, 643, 646, 345; 250/531, 535, 539

[56] References Cited

U.S. PATENT DOCUMENTS

| | | | |
|---|---|---|---|
| 3,808,068 | 4/1974 | Johnson et al. | 156/628 |
| 3,915,757 | 10/1975 | Engel | 204/192 N |
| 4,057,895 | 11/1977 | Ghezzo | 156/628 |
| 4,074,139 | 2/1978 | Pankove | 204/192 N |
| 4,092,209 | 5/1978 | Ipri | 156/628 |
| 4,093,503 | 6/1978 | Harris et al. | 156/628 |
| 4,108,715 | 8/1978 | Ishikawa | 156/628 |
| 4,243,506 | 1/1981 | Ikeda et al. | 204/192 E |

FOREIGN PATENT DOCUMENTS 2717400  10/1978  Fed. Rep. of Germany ...... 156/643

OTHER PUBLICATIONS

"Reversal Etching of Chromium Film in Gas Plasma", 10-1979, pp. 1794-1798, Solid State Science and Technology.

Primary Examiner—M. H. Paschall
Attorney, Agent, or Firm—Robert E. Burns; Emmanuel J. Lobato; Bruce L. Adams

[57] ABSTRACT

Ions of a metal which becomes passive under the presence of oxygen with regard to plasma etching are implanted into selected portions of the surface of a workpiece, after which the workpiece is subjected to plasma etching with a reaction gas mixed with oxygen, whereby that layer which has been rendered passive acts as a mask, and an etched pattern is formed.

4 Claims, 6 Drawing Figures

4,377,734

METHOD FOR FORMING PATTERNS BY PLASMA ETCHING

BACKGROUND OF THE INVENTION

1. Field of the Invention

This invention relates to a method for forming etched patterns which are used for example in the process of manufacturing semiconductor elements.

2. Description of the Prior Art

A prior method of forming fine etched patterns is shown in FIGS. 1 to 4. In this prior example, when, as shown in FIG. 1, a polycrystalline silicon layer 2 formed on a silicon oxide layer 1 is to be worked to a fine pattern, after coating a positive photoresist 3 onto the polycrystalline silicon layer 2, the photoresist 3 is exposed to light as indicated by arrows 4, through a predetermined photo-mask (not shown), at portions corresponding to the fine pattern. This is then chemically developed so that only the hardened photoresist 3 in those portions exposed to the light remains. Then, with this photoresist 3 as a mask, the aforementioned polycrystalline silicon layer 2 is etched away as shown in FIG. 3, and by chemically removing the remaining photoresist 3, a desired fine pattern as shown in FIG. 4 is formed in the polycrystalline silicon layer 2.

However, this prior method of fine pattern forming has drawbacks in that it involves many steps, and has a tendency to become complicated because of the use of a photoresist as the pattern etching mask, and further, as can be seen in FIG. 2, the exposure to light and developing of the photoresist produce dimensional errors in the pattern obtained, because the resist pattern formed is not very sharp or well defined, and so there are limits to the fineness, and there is the problem of contamination that accompanies the chemical treatment of using a resist, etc.

SUMMARY OF THE INVENTION

Accordingly, an object of the present invention is to provide a simple process of etched pattern forming.

Another object of the present invention is to provide an etched pattern forming method which enables the forming of patterns with a high degree of precision.

Still another object of the present invention is to provide an etched pattern forming method which does not contaminate the workpiece.

With the above objects in view, according to the present invention, ions of a metal which becomes passive under the pressure of oxygen with regard to plasma etching are implanted into selected positions of the surface of a workpiece, after which the workpiece is subjected to plasma etching with an etching gas mixed with oxygen, whereby that layer which has been rendered passive acts as a mask, and a pattern is formed.

BRIEF DESCRIPTION OF THE DRAWINGS

The present invention will be described in more detail in conjuction with a preferred embodiment shown in the accompanying drawings; in which.

In the drawings identical reference numerals indicate like or corresponding parts.

DESCRIPTION OF THE PREFERRED EMBODIMENT

Figure 1:
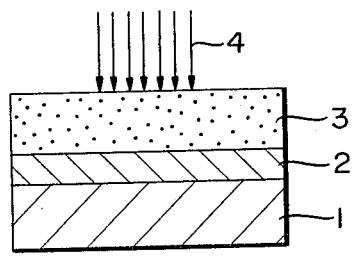
FIGS. 1 to 4 illustrate graphically the sequence of steps of a method of forming fine patterns according to the prior art.
Figure 2:
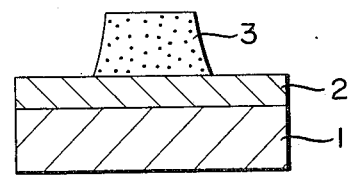
Figure 3:
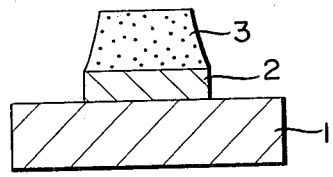
Figure 4:
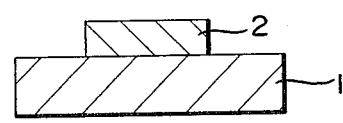
Figure 5:
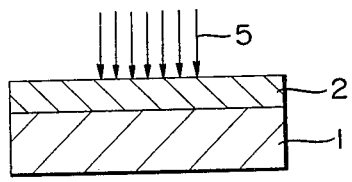
FIGS. 5 and 6 illustrate graphically the sequence of steps according to one embodiment of a method of forming fine patterns according to the present invention.

According to one embodiment of the method of the present invention, a workpiece comprising a polycrystalline silicon layer 2 formed on a silicon oxide substrate 1 is subjected to ion implantation as illustrated by arrows 5 in FIG. 5 so that a desired pattern is formed on the surface of the polycrystalline silicon layer 2. The ion pattern on the polycrystalline silicon layer 2 may be formed by any suitable pattern forming technique but is preferably formed by scanning a beam of ions over the pattern to be formed. The ions to be implanted may preferably be ions of tungsten which is capable of forming a passivator against the subsequent plasma etching. Other metals that may be used in the present invention include niobium and tin. It is known that all these metals form a passivator under the presence of oxygen, and the passivator is inactive against the plasma reaction. The ion implanted workpiece may preferably have a tungsten ion concentration of about $10^{16}$ atoms/cm$^3$ in its surface.

Figure 6:
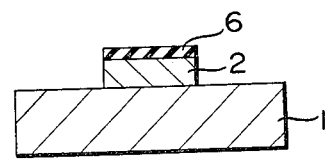

The workpiece thus ion implanted is then subjected to a plasma etching process with a reaction gas containing a mixture of $CF_4$ and oxygen under normal plasma etching conditions well known in the art. During the etching process, the metal, preferably tungsten, implanted in the workpiece surface is brought into the passive state by the formation of $WO_3$ by oxidization of the tungsten due to oxygen contained in the plasma reaction gas. The tungsten layer in the passive state is inactive or passive against plasma etching and therefore it serves as a mask for etching, so that the portion of the polycrystalline silicon layer 2 covered by the passive state tungsten oxide layer 6 remains unetched while the other portion of the polycrystalline silicon layer 2 exposed to the plasma etching gas is etched away in the manner well known in the art to provide a pattern formed from polycrystalline silicon layer 2 on the silicon oxide substrate 1 as shown in FIG. 6.

The remaining passivator layer 6 may be left in place or removed as desired, in accordance with the use to be made of the workpiece.

The same plasma etching gas as previously described may be used when niobium ions or tin ions are used in place of tungsten ions and the workpiece is polycrystalline silicon. The passivator formed would be niobium oxide or tin oxide.

When the aluminum workpiece is to be etched, the plasma reaction gas should be changed to a gas containing $CCl_4$ and oxygen, and when an $SiO_2$ workpiece is to be etched the etching gas should be a gas containing $C_3F_8$ and oxygen. In all the above cases, metal implanted in the workpiece surface in the form of ions may be tungsten, niobium or tin, although tungsten is preferable.

As explained in detail hereinabove, according to the present invention ions of a metal which forms a passivator against plasma etching are implanted in the surface portion of a workpiece in a desired pattern, and then, with this metal ion implanted layer as a mask, the workpiece is plasma etched with an etching gas mixed with oxygen, fine patterns of high precision can be formed easily and simply with fewer working steps than heretofore, and, since a photoresist is not used, there is no need to carry out any extra chemical treatment, and so the working can be done in a state of cleanliness.

What is claimed is:

1. A method of forming etched patterns on the surface of a workpiece comprising, providing a workpiece to be etched consisting of either polycrystalline silicon, or aluminum, or silicon dioxide, implanting the workpiece surface in a desired pattern with ions of a metal selected from the group consisting of tungsten, niobium and tin in preparation of conversion of portions of the workpiece having said ions in said pattern into a passivator during plasma etching under the presence of oxygen thereby to render said desired pattern on said surface unetchable during said etching, and without further preparation plasma etching the metal ion implanted workpiece with an etching gas mixed with oxygen appropriate to the metal selected, whereby said portions having said pattern remain unetched.

2. A method of forming patterns as claimed in claim 1, wherein the etching gas used in etching the workpiece is a gas comprising a mixture of $CF_3$ and oxygen.

3. A method of forming etched patterns as claimed in claim 1, wherein said workpiece is aluminum, said metal ions are the ions of a metal selected from said group consisting of tungsten, niobium and tin, and said plasma etching gas is $CCl_4$.

4. A method of forming etched patterns as claimed in claim 1, wherein said workpiece is silicon dioxide, said metal ions are the ions of a metal selected from said group consisting of tungsten, niobium and tin, and said plasma etching gas is $C_3F_8$.

* * * * *